(12) United States Patent
Lim

(10) Patent No.: US 8,252,683 B2
(45) Date of Patent: Aug. 28, 2012

(54) 3D INTERCONNECTION STRUCTURE AND METHOD OF MANUFACTURING THE SAME

(75) Inventor: Kwon-Seob Lim, Gwangju (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 100 days.

(21) Appl. No.: 12/878,263

(22) Filed: Sep. 9, 2010

(65) Prior Publication Data

US 2011/0127649 A1 Jun. 2, 2011

(30) Foreign Application Priority Data

Nov. 30, 2009 (KR) .................. 10-2009-0116785

(51) Int. Cl.
*H01L 21/44* (2006.01)

(52) U.S. Cl. ........ 438/667; 438/637; 438/638; 438/668; 438/673; 438/675; 438/640; 257/618; 257/621; 257/622; 257/667; 257/698; 257/774; 257/E23.067; 257/E23.145; 257/E23.011; 216/13; 216/17; 216/18; 216/39; 174/359; 174/360; 174/650; 174/262; 174/97

(58) Field of Classification Search .................. 257/618, 257/621, 622, 667, 698, 774, E23.067, E23.145, 257/E23.011; 438/637, 638, 667, 668, 673, 438/675, 640; 216/13, 17, 18, 39; 174/359, 174/360, 650, 262, 97, 106 D
See application file for complete search history.

(56) References Cited

U.S. PATENT DOCUMENTS

| 5,166,097 A | * | 11/1992 | Tanielian ................. 438/667 |
| 6,091,027 A | | 7/2000 | Hesselbom et al. |
| 6,400,172 B1 | * | 6/2002 | Akram et al. ............ 324/756.05 |
| 6,716,737 B2 | | 4/2004 | Plas et al. |
| 7,057,274 B2 | | 6/2006 | Heschel |
| 7,294,921 B2 | | 11/2007 | Ahn et al. |
| 7,495,462 B2 | | 2/2009 | Hua et al. |
| 8,101,865 B2 | * | 1/2012 | Ikeda ..................... 174/255 |
| 2006/0021794 A1 | * | 2/2006 | Cheng ..................... 174/264 |
| 2006/0292866 A1 | * | 12/2006 | Borwick et al. ............. 438/667 |
| 2007/0045779 A1 | * | 3/2007 | Hiatt ..................... 257/621 |
| 2008/0081398 A1 | * | 4/2008 | Lee et al. .................. 438/109 |
| 2009/0269931 A1 | * | 10/2009 | Neuilly et al. ............. 438/700 |
| 2010/0001378 A1 | * | 1/2010 | DeNatale et al. ............ 257/621 |
| 2010/0307807 A1 | * | 12/2010 | Noda et al. ............... 174/264 |
| 2011/0309854 A1 | * | 12/2011 | Chou et al. ............... 324/756.03 |

FOREIGN PATENT DOCUMENTS

| KR | 1020080031075 A | 4/2008 |
| KR | 1020080035484 A | 4/2008 |
| KR | 1020080095944 A | 10/2008 |

* cited by examiner

*Primary Examiner* — Meiya Li

(57) ABSTRACT

Provided are a three-dimensional (3D) interconnection structure and a method of manufacturing the same. The 3D interconnection structure includes a wafer that has one side of an inverted V-shape whose middle portion is convex and a lower surface having a U-shaped groove for mounting a circuit, and a first electrode formed to cover a part of the inverted V-shaped one side of the wafer and a part of the U-shaped groove.

14 Claims, 11 Drawing Sheets

3D INTERCONNECTION STRUCTURE AND METHOD OF MANUFACTURING THE SAME

CROSS-REFERENCE TO RELATED APPLICATION

This application claims priority to and the benefit of Korean Patent Application No. 10-2009-0116785, filed Nov. 30, 2009, the disclosure of which is incorporated herein by reference in its entirety.

BACKGROUND

1. Field of the Invention

The present invention relates to a three-dimensional (3D) interconnection structure and a method of manufacturing the same, and more particularly, to a 3D interconnection structure for interconnection of chips or packages three-dimensionally stacked using a wafer or interconnection between upper and lower surfaces of a wafer and a method of manufacturing the 3D interconnection structure.

2. Discussion of Related Art

With the remarkable development of information technology (IT), market demand for products in which several functions converge in one terminal is increasing, and a great deal of research for three-dimensionally stacking multifunctional chips or packages is under way. FIG. 1 illustrates an example of a 3D stacked package employing conventional wire bonding. Referring to FIG. 1, wire bonding is used for connection between chips and also between a chip and a package. However, wire bonding deteriorates performance and increases a package size.

Another conventional 3D interconnection method employs through-silicon via (TSV) technology in which via hole is formed in a silicon wafer and then plated. Since TSV technology enables micro-processing, it is frequently used for electronic chips that involve many inputs and outputs, and thin wafers are frequently used for it. However, it is difficult to transfer signals at a high speed, and significant signal loss occurs. To solve these problems, that is, to enable high-speed signal transmission and minimize signal loss, research on polymer-shield (PS)-TSV technology in which the core of via is insulated by low-loss dielectric is under way. However, it is difficult to perform a PS-TSV process, and the process cost is high.

In yet another 3D interconnection method, a V-shaped through hole is formed by wet-etching a silicon wafer, and then an electrode is deposited to connect the upper and lower surfaces of the wafer. In this case, the width of the through hole on one side is too small to form a plurality of electrodes or to transfer signals at a high speed. Also, it is difficult to perform a photoresist process due to the through hole.

FIG. 2 is a perspective view of an example of a bidirectional optical transceiver sub-module. In this structure, a transmitter and receiver are both mounted on the upper surface of a platform, and significant electrical or optical crosstalk occurs. Such a conventional bidirectional optical communication module having a transmitter and receiver generally employs two packages for the transmitter and receiver and a metal housing for connecting the two packages to minimize electrical or optical crosstalk between the transmitter and receiver. This process is complicated and expensive. Also, even when the transmitter and receiver are disposed on one plane of one platform, the above-mentioned electrical or optical crosstalk still occurs.

SUMMARY OF THE INVENTION

The present invention is directed to a three-dimensional (3D) interconnection structure that facilitates a process for a wafer having a thickness of several hundred micrometers or more as well as a wafer having a thickness of less than several hundred micrometers, enables high-speed signal transmission and can transfer a plurality of signals, and a method of manufacturing the same.

One aspect of the present invention provides a 3D interconnection structure including: a wafer having one side of an inverted V-shape whose middle portion is convex, and a lower surface having a U-shaped groove for mounting a circuit; and a first electrode formed to cover a part of the inverted V-shaped one side of the wafer and a part of the U-shaped groove.

A part of the lower surface covered by the first electrode may be etched to a thickness of the first electrode or more in comparison with the other part of the lower surface.

The 3D interconnection structure may further include a second electrode formed to cover a part of the inverted V-shaped one side of the wafer and a part of an upper surface of the wafer.

The first electrode and the second electrode may be in contact with each other on the inverted V-shaped one side of the wafer.

The first electrode may be connected with another package by soldering or wire bonding.

Another aspect of the present invention provides a method of manufacturing a 3D interconnection structure including: preparing a wafer; forming a V-groove on a lower surface of the wafer; forming a U-shaped groove for mounting a circuit on the lower surface of the wafer on both sides of the V-groove; forming an electrode on the lower surface of the wafer to cover a part of the V-groove and a part of the U-shaped groove; and forming a through hole on an upper surface of the wafer to expose the electrode.

The method may further include forming a trench to be connected with the V-groove on the lower surface of the wafer. Here, the electrode may be formed to cover the part of the V-groove, a part of the trench, and the part of the U-shaped groove.

The electrode may be connected with another package by soldering or wire bonding.

The method may further include forming a polymer on the lower surface of the wafer to isolate the electrode from a material formed under the wafer and facilitate a soldering process.

A photosensitive polymer may be used as the polymer to facilitate patterning.

Yet another aspect of the present invention provides a method of manufacturing a 3D interconnection structure including: preparing a wafer; forming a first V-groove on an upper surface of the wafer; forming a first electrode to cover a part of the upper surface of the wafer and a part of the first V-groove; forming a second V-groove on a lower surface of the wafer; forming a second electrode to cover a part of the lower surface of the wafer and a part of the second V-groove; and forming a through hole to connect the first electrode with the second electrode.

The method may further include forming a U-shaped groove for mounting a circuit on the lower surface of the wafer on both sides of the second V-groove.

The method may further include forming a trench to be connected with the second V-groove on the lower surface of the wafer. Here, the second electrode may be formed to cover the part of the second V-groove, a part of the trench, and the part of the U-shaped groove.

The second V-groove may be formed symmetrically to the first V-groove.

The second V-groove may be formed to leave a part of the wafer and not to connect the first V-groove with the second V-groove.

The method may further include connecting the first electrode or the second electrode with another package by soldering or wire bonding.

The first electrode may be formed on both sides of the first V-groove to be disconnected at a center of the first V-groove.

The second electrode may be formed on both sides of the second V-groove to be disconnected at a center of the second V-groove.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

Hereinafter, exemplary embodiments of the present invention will be described in detail. However, the present invention is not limited to the embodiments disclosed below but can be implemented in various forms. The following embodiments are described in order to enable those of ordinary skill in the art to embody and practice the present invention. To clearly describe the present invention, parts not relating to the description are omitted from the drawings. Like numerals refer to like elements throughout the description of the drawings.

For convenience, only a part of a wafer will be symmetrically illustrated.

The present invention relates to a three-dimensional (3D) interconnection method and a device using the same. FIGS. 3A to 3F illustrate a method of manufacturing a 3D interconnection structure according to a first exemplary embodiment of the present invention.

Figure 3A:
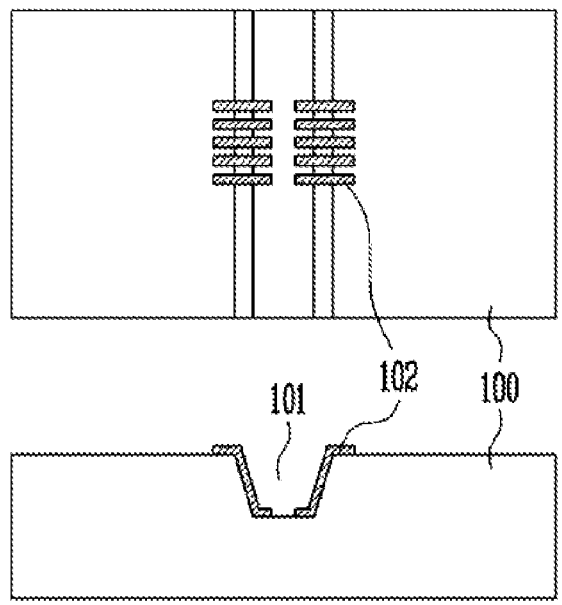
FIGS. 3A to 3F illustrate a method of manufacturing a 3D interconnection structure according to a first exemplary embodiment of the present invention.

FIG. 3A shows an upper view and front view of a wafer 100 on whose upper surface a first V-groove 101 is formed in the central portion, and in which first electrodes 102 for connection with the lower surface of the wafer 100 are symmetrically formed on the first V-groove 101. The first electrodes 102 are formed to cover a part of the upper surface of the wafer 100, a part of the slope of the first V-groove 101, and a part of the bottom of the first V-groove 101 in consideration of connection with another electrode. The first electrodes 102 may be formed at a predetermined interval on the both slopes of the first V-groove 101 so as not to be damaged when the wafer 100 is diced into separate blocks. In other words, the first electrodes 102 are formed on the both sides of the first V-groove 101 to be disconnected at the center of the first V-groove 101.

Figure 3B:
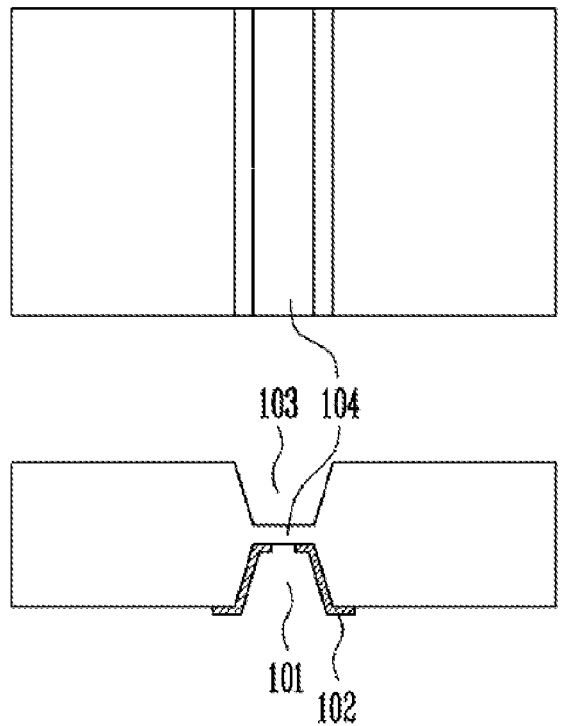

FIG. 3B shows a lower view and front view of the wafer 100 on whose lower surface a second V-groove 103 is formed. As shown in FIG. 3B, a part 104 of the wafer 100 may be left between the first V-groove 101 and the second V-groove 103 so that the wafer 100 is not penetrated. When a through hole is formed in the wafer 100, it is difficult to perform a photoresist process, etc., thereafter. At this time, the second V-groove 103 is formed symmetrically to the first V-groove 101.

Figure 3C:
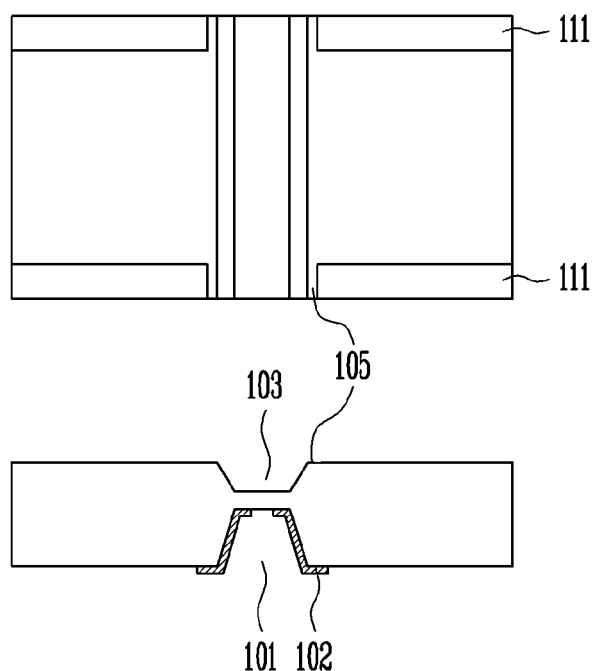

FIG. 3C shows a lower view and cross-sectional view of the wafer 100 whose lower surface is partially etched to form flat trenches 105 connected with the second V-groove 103. The trenches 105 are formed so that an electrode formed on the lower surface of the wafer 100 is not electrically short-circuited with a part formed under the wafer 100. Non-etched bridges 111 are formed on the both sides of the lower surface of the wafer 100. In other words, the electrode formed in the lower surface of the wafer 100 is formed on the trenches 105, and this does not come in contact with a material formed under the wafer 100 when the lower surface of the wafer 100 is installed in a package or metal housing. The etching process can be selectively used, and is useful for respectively disposing bidirectional transmission and reception modules on the upper and lower surfaces of the platform 100. The trenches 105 may have a larger thickness than second electrodes 107 to be formed.

Figure 3D:
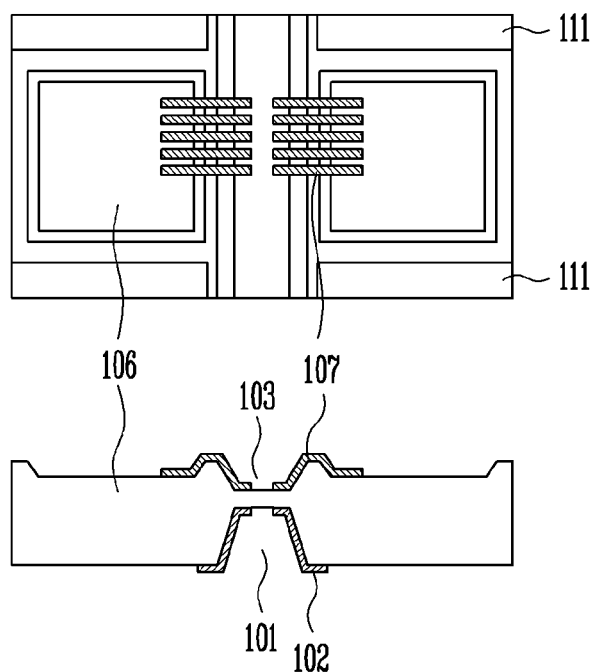

FIG. 3D shows a lower view and cross-sectional view of the wafer 100 whose lower surface is additionally etched to form U-shaped grooves 106 for mounting a component, etc., on the both sides of the second V-groove 103, and in which the second electrodes 107 are formed. When no component, etc., is mounted on the lower surface of the wafer 100, the etching process for forming the U-shaped grooves 106 may be skipped. The second electrodes 107 are formed to connect the second V-groove 103, the trenches 105 and the U-shaped grooves 106. In other words, the second electrodes 107 are formed on the both sides of the second V-groove 103 and disconnected at the center of the second V-groove 103.

Figure 3E:
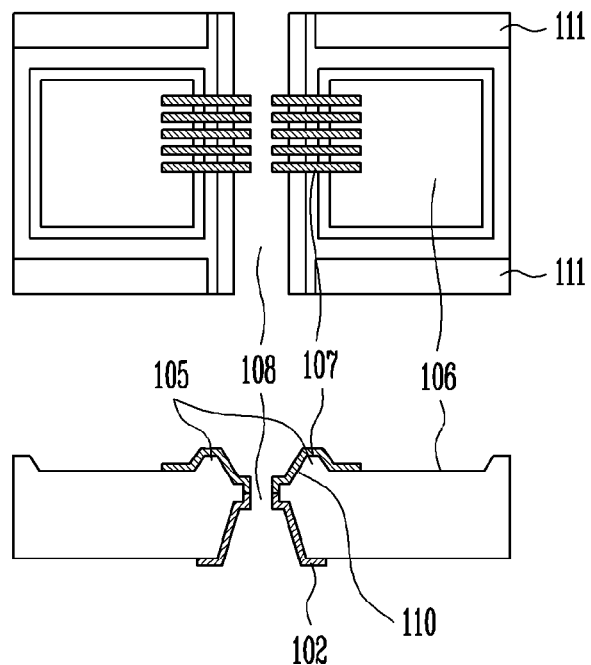
Figure 3F:
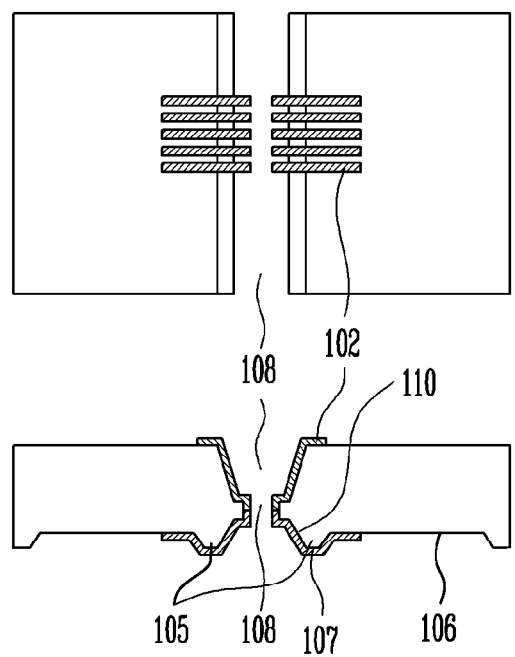

FIGS. 3E and 3F show a lower view, upper view and cross-sectional views of the wafer 100 after the part 104 left to facilitate the following process is etched to form a through hole 108. The first electrodes 102 formed on the upper surface of the wafer 100 are electrically connected with the second electrodes 107 formed through the lower surface of the wafer 100 by plating, etc.

Figure 4A:
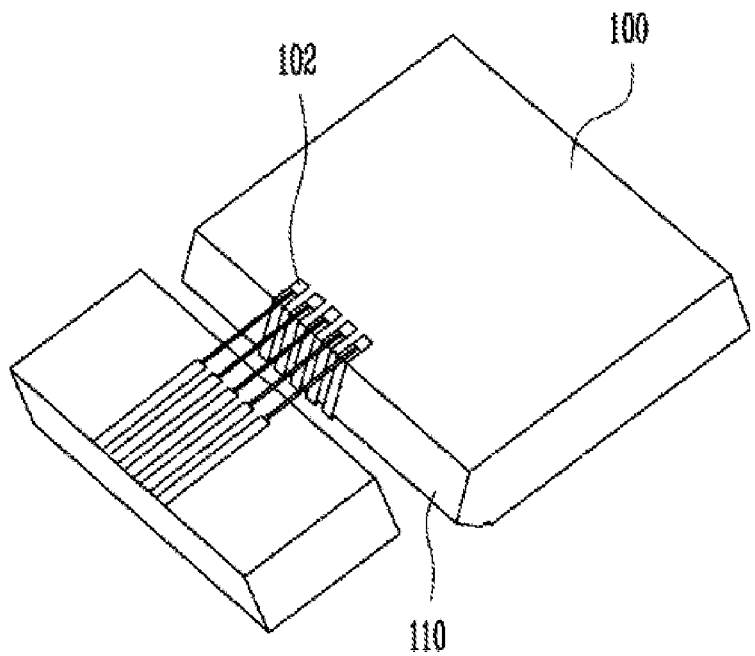
FIGS. 4A and 4B are perspective views of a 3D interconnection structure implemented by the method according to the first exemplary embodiment of the present invention.
Figure 4B:
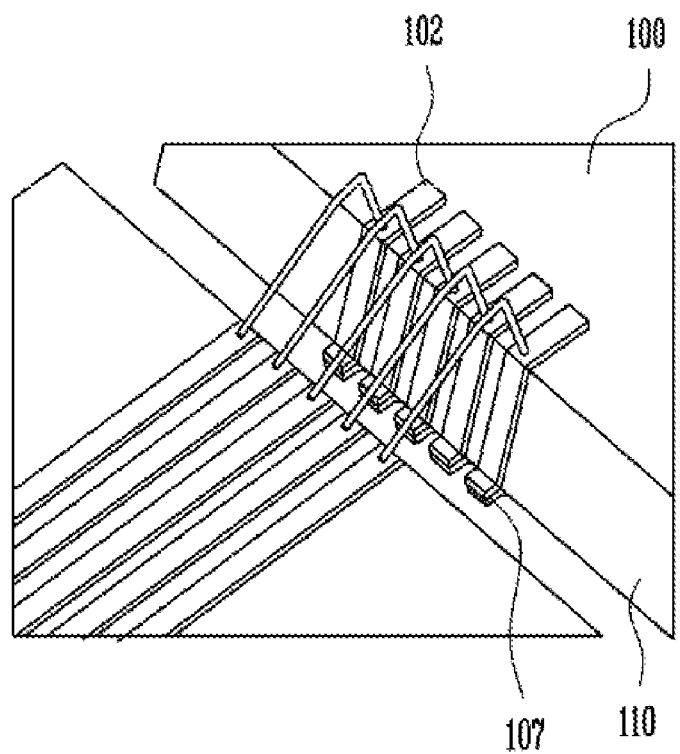

FIGS. 4A and 4B are perspective views of a 3D interconnection structure implemented by the method according to the first exemplary embodiment of the present invention.

Referring to FIGS. 3E, 3F, 4A and 4B, the 3D interconnection structure according to the first exemplary embodiment of the present invention has one side 110 of an inverted V-shape whose middle portion is convex, and includes the second electrodes 107 formed on the lower surface of the wafer 100 to cover a part of the wafer 100 having the U-shaped groove 106 for mounting a circuit, a part of the one side 110 of the wafer 100, and a part of the U-shaped groove 106. The trench 105 is formed on a part of the lower surface covered by the second electrodes 107, that is, a part of the lower surface is etched to the thickness of the second electrodes 107 or more, unlike the other part of the lower surface that comes in contact with a material formed under the wafer 100. Thus, the trench 105 prevents the second electrodes 107 from coming in contact with a material and being short-circuited. In other words, the bridges 111 generated on the both sides of the lower surface of the wafer 100 by forming the trenches 105 come in contact with a material formed under the wafer 100 and prevent the second electrodes 107 from being short-circuited. The first electrodes 102 are formed to cover the part of the one side 110 of the wafer 100 and the part of the upper surface of the wafer 100, and come in contact with the second electrodes 107 on the one side 110 of the wafer 100. The first electrodes 102 or the second electrodes 107 are connected with another package by soldering or wire-bonding to be packaged.

FIGS. 5A to 5F illustrate a method of manufacturing a 3D interconnection structure according to a second exemplary embodiment of the present invention.

Figure 5A:
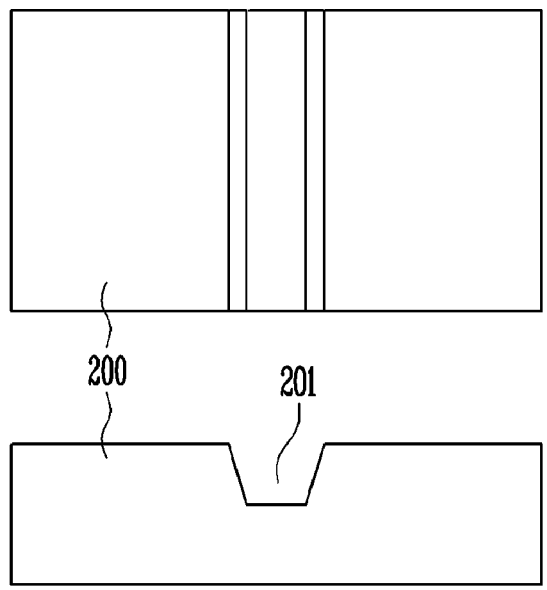
FIGS. 5A to 5F illustrate a method of manufacturing a 3D interconnection structure according to a second exemplary embodiment of the present invention.

FIG. 5A shows a lower view and front view of a wafer 200 on whose lower surface a V-groove 201 is formed.

Figure 5B:
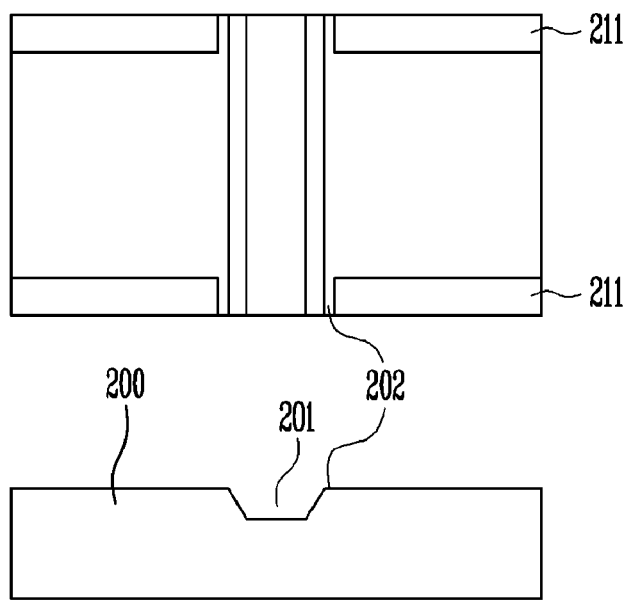

FIG. 5B shows a lower view and cross-sectional view of the wafer 200 that has undergone an etching process for forming trenches 202 connected with the V-groove 201 to prevent short circuit with a package, as described above.

Figure 5C:
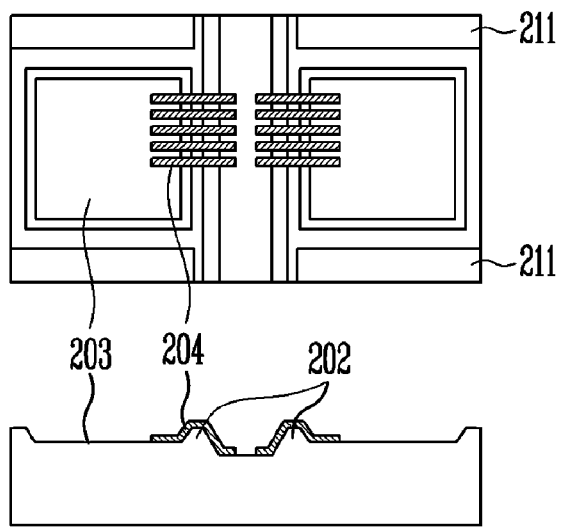

FIG. 5C shows a lower view and cross-sectional view of the wafer 200 that has undergone an etching process for forming U-shaped grooves 203 on the both sides of the V-groove 201 to mount components on the lower surface of the wafer 200, and in which electrodes 204 are formed, as described above. The electrodes 204 are formed as described above. The electrodes 204 are formed to connect the V-groove 201, the trenches 202 and the U-shaped groove 203. The lower surface of the wafer 200 is etched to form the trenches 202, and thereby bridges 211 of the wafer 200 that come in contact with a surface under the wafer 200 are formed.

Figure 5D:
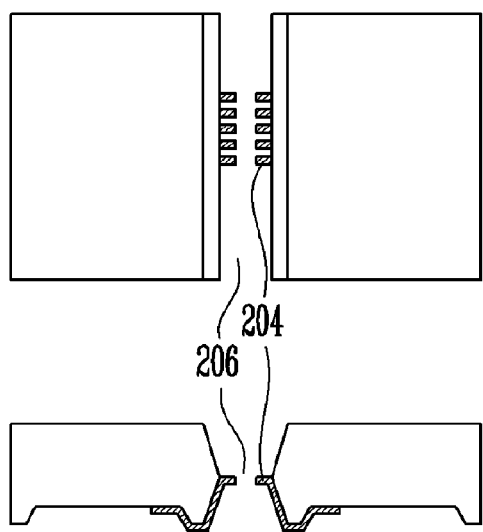

FIG. 5D shows an upper view and cross-sectional view of the wafer 200 on whose upper surface a V-groove is formed. At this time, it is important to form a through hole 206 to expose the electrodes 204 formed on the lower surface. It is possible to form a 3D interconnection using the electrodes 204 exposed through the through hole 206 as electrode pads for wire bonding or soldering a lead line.

Also, to facilitate the wire-bonding or soldering process, the thickness of the electrodes 204 may be increased by plating, etc.

Figure 5E:
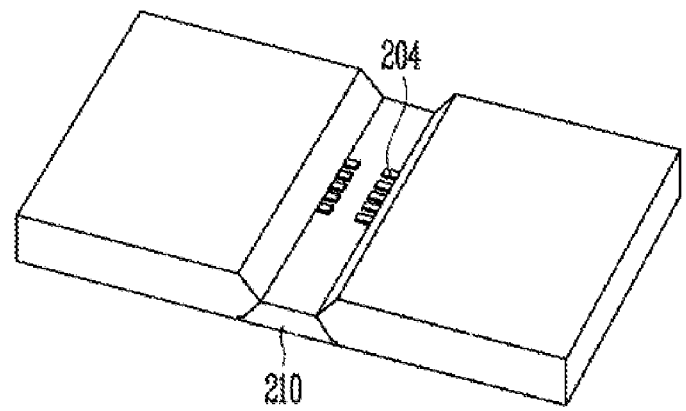
Figure 5F:
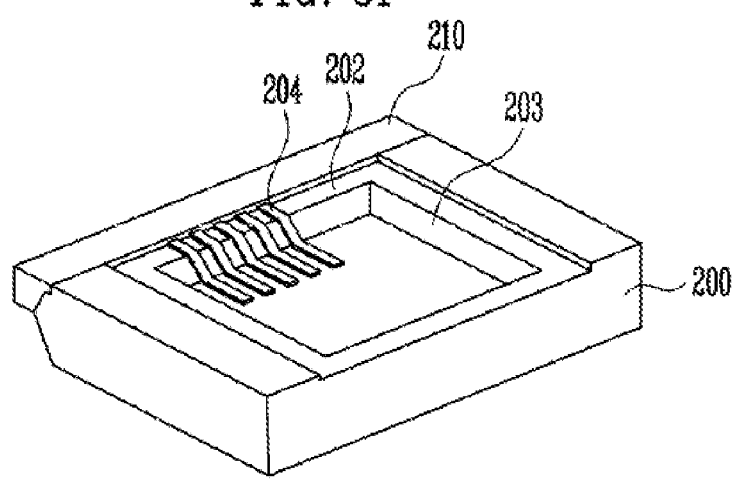

When the V-groove is filled with a polymer 210 as shown in FIG. 5E before an etching process for forming the through hole 206 after the electrodes 204 are formed, the wire-bonding or soldering process is facilitated, and it is possible to reduce the thickness of the electrodes 204 and improve the reliability of a product. Also, the electrodes 204 can be isolated from a bottom surface by the polymer 210 as shown in FIG. 5F. In this case, a photosensitive polymer may be used to be readily patterned. Since the electrodes 204 are only formed on the lower surface of the wafer 200 in the 3D interconnection structure according to the second exemplary embodiment of the present invention, 3D interconnection is enabled regardless of the thickness of the wafer 200. Also, an electrical length can be minimized, and thus the 3D interconnection structure is appropriate for high-speed signal transmission.

Figure 6A:
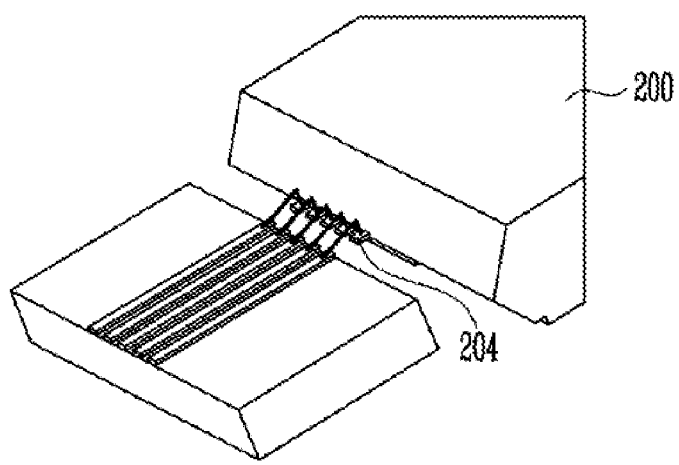
FIGS. 6A and 6B are perspective views of a 3D interconnection structure implemented by the method according to the second exemplary embodiment of the present invention.
Figure 6B:
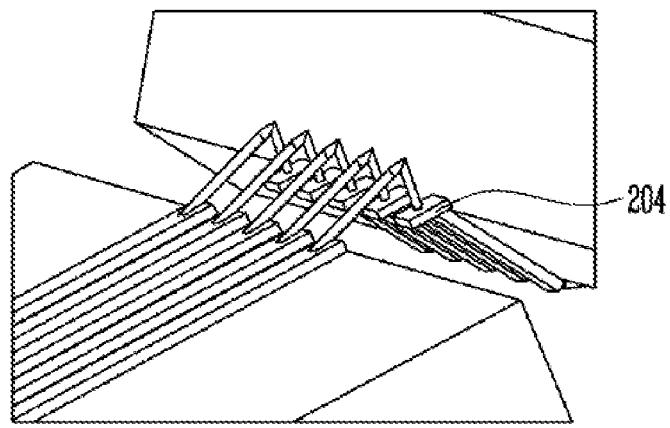

FIGS. 6A and 6B are perspective views of a 3D interconnection structure implemented by the method described with reference to FIG. 5. FIG. 6A shows the 3D interconnection structure connected with another package through electrodes formed on the lower surface of a wafer by wire bonding, and FIG. 6B is an enlarged view of a part of FIG. 6. As mentioned above, a lead line can be used. The 3D interconnection structure according to this exemplary embodiment of the present invention is similar to that of FIGS. 4A and 4B except that the first electrodes 102 are not included.

Figure 1:
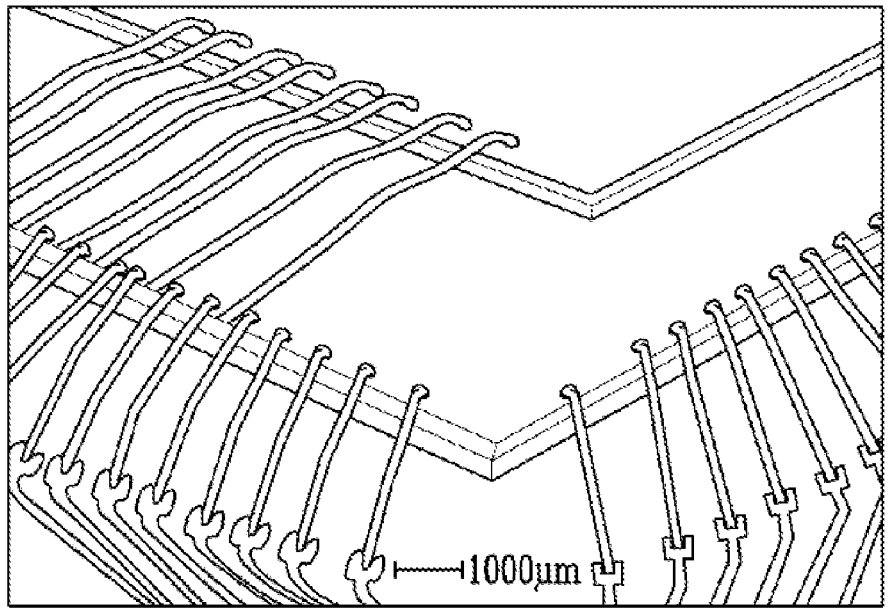
FIG. 1 illustrates an example of a three-dimensional (3D) stacked package employing conventional wire bonding.
Figure 2:
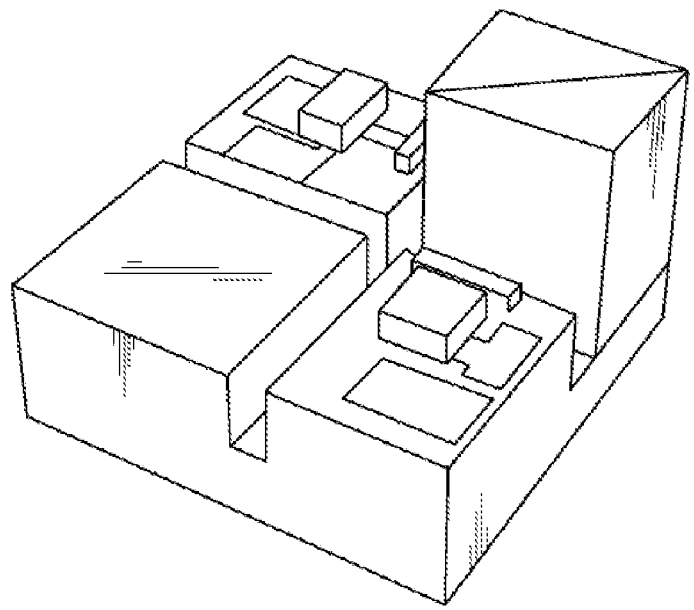
FIG. 2 is a perspective view of an example of a conventional bidirectional optical transceiver sub-module.
Figure 7A:
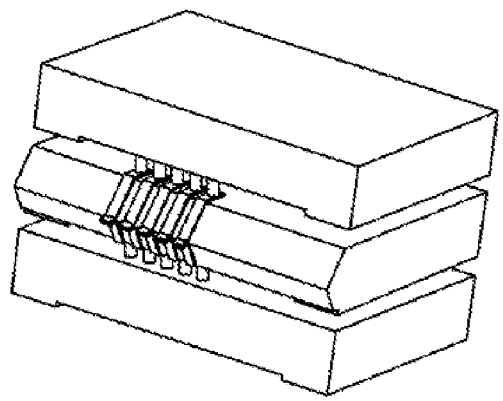
FIGS. 7A and 7B are perspective views of chips or packages three-dimensionally stacked in three layers according to the first exemplary embodiment of the present invention, and chips or packages three-dimensionally stacked and connected with another package according to the first and/or second exemplary embodiments of the present invention.

FIG. 7A shows chips or packages three-dimensionally stacked in three layers according to the first exemplary embodiment of the present invention. This is an example of chips or packages that are stacked using a solder bump or ball instead of conventional wire-bonding illustrated in FIG. 1 and then three-dimensionally interconnected. In this way, an electrode can be packaged with another package by flip-chip bonding.

Figure 7B:
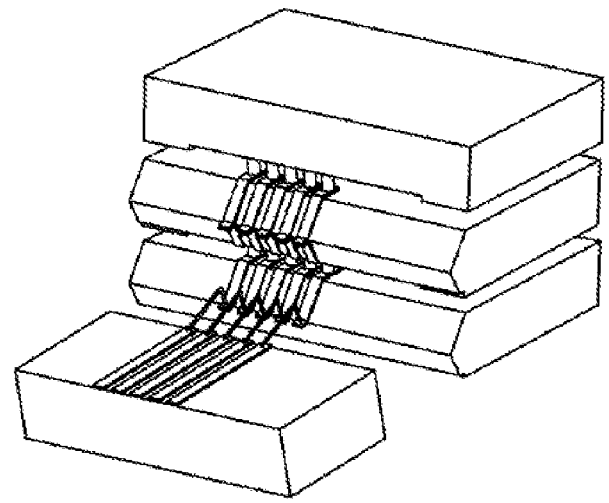

FIG. 7B shows an example of chips or packages that are three-dimensionally stacked according to both of the first and second exemplary embodiments of the present invention and connected with another package.

Figure 8:
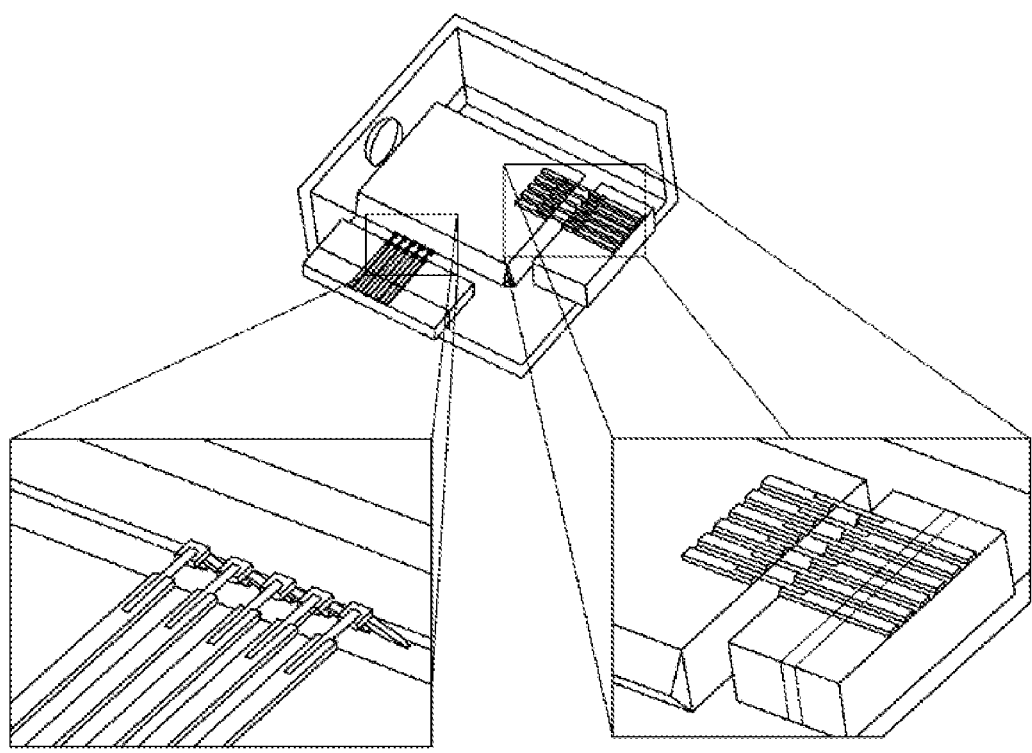
FIG. 8 is a perspective view of an example in which a transmitter and receiver are respectively mounted on the upper and lower surfaces of a wafer respectively, three-dimensionally interconnected according to the second exemplary embodiment of the present invention, and then connected using a lead line and feed line of a metal housing.

FIG. 8 is a perspective view of an example in which a transmitter and receiver are respectively mounted on the upper and lower surfaces of a wafer, three-dimensionally interconnected according to the second exemplary embodiment of the present invention, and then connected using a feed line and lead line of a metal housing. As mentioned above, wire bonding can be used instead of a lead line. This constitution can minimize electrical or optical crosstalk of a bidirectional optical transceiver module.

An enlarged view on the lower left shows a 3D interconnection of one of the transmitter and receiver of the bidirectional optical transceiver module mounted on the lower surface of the wafer. An enlarged view on the lower right shows a connection of the other one of the transmitter and receiver mounted on the upper surface of the wafer.

Figure 9A:
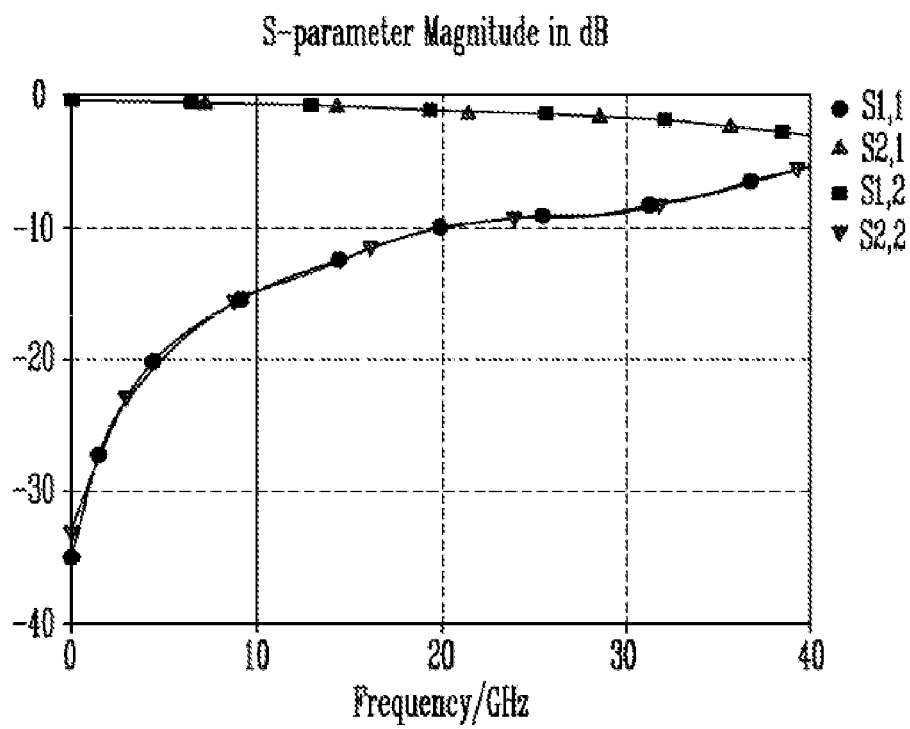
FIGS. 9A and 9B are graphs showing the frequency characteristics of a 3D interconnection structure designed according to the second exemplary embodiment of the present invention.
Figure 9B:
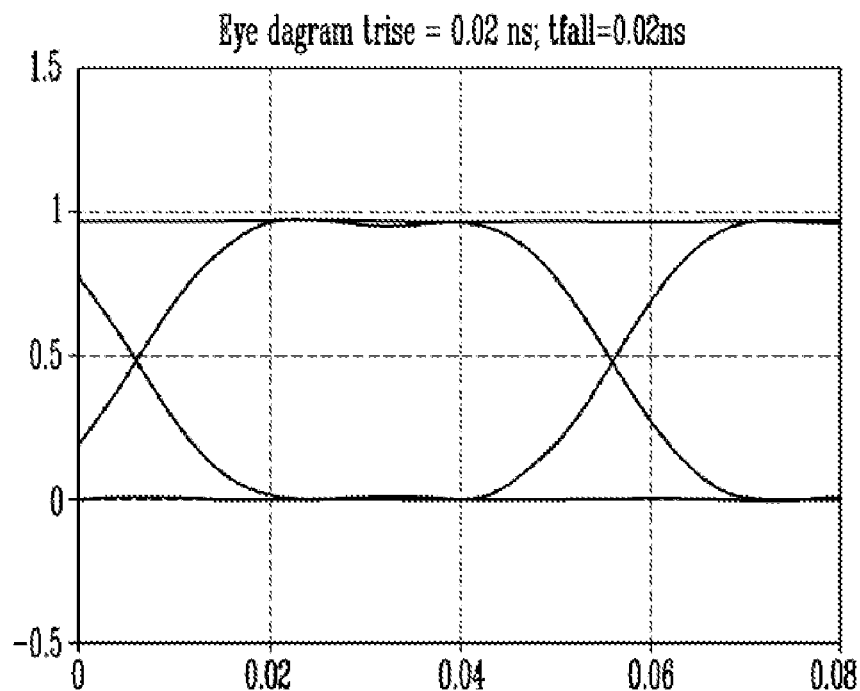

FIGS. 9A and 9B are graphs showing the frequency characteristics of a 3D interconnection structure designed according to the method illustrated in FIG. 6A. FIG. 9A shows a scattering parameter, and FIG. 9B shows an eye diagram (transmission rate: 20 Gbit/s). Here, the physical length of a differential line including a wire bonding was about 5.3 mm, and a wafer employed a high resistivity (about 7 kΩ·cm) silicon substrate. As shown in FIG. 9A, signals were transferred even at a transmission rate of 20 Gbit/s with no problem.

Using a 3D interconnection structure and method of manufacturing the same according to exemplary embodiments of the present invention, it is possible to form an interconnection in a 3D structure in which wafers or platforms having a thickness of several hundred micrometers or more as well as wafers or platforms having a thickness of less than several hundred micrometers are stacked. In other words, a 3D interconnection can be formed regardless of the thickness of wafers. Also, the 3D interconnection structure and method of manufacturing the same enable signal transmission at a low speed and a high speed of several Gbit/s. Since it is possible to transfer a plurality of signals, the 3D interconnection structure and method of manufacturing the same are appropriate for 3D stacked modules or platforms, silicon interposers or carriers, bidirectional communication modules, etc., according to various forms and applications. The 3D interconnection structure does not have a through hole, etc., during a wafer process and thus facilitates a process such as photoresist deposition. In the case of a bidirectional communication module having a transmitter and receiver, two platforms or packages can be implemented by one platform or package, and the transmitter and receiver implemented on one surface of one platform are respectively disposed on the both surfaces of the platform to minimize electrical or optical crosstalk.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method of manufacturing a three-dimensional (3D) interconnection structure, comprising:
   preparing a wafer;
   forming a V-groove on a lower surface of the wafer;
   forming U-shaped grooves on the lower surface of the wafer respectively on both sides of the V-groove;
   forming an electrode on the lower surface of the wafer to cover a part of the V-groove, and a part of the U-shaped grooves; and
   forming a through hole extending from an upper surface of the wafer to expose the electrode on the part of the V-groove.

2. The method of claim 1, further comprising forming a trench to be connected with the V-groove on the lower surface of the wafer, wherein the electrode is formed to cover the part of the V-groove, a part the trench, and the part of the U-shaped grooves.

3. The method of claim 1, further comprising connecting the electrode with another package by soldering or wire bonding.

4. The method of claim 1, further comprising forming a polymer on the lower surface of the wafer to isolate the electrode from a material disposed under the wafer.

5. The method of claim 4, wherein the polymer is a photosensitive polymer.

6. A method of manufacturing a three-dimensional (3D) interconnection structure, comprising:
   preparing a wafer;
   forming a first V-groove on an upper surface of the wafer;
   forming a first electrode to cover a part of the upper surface of the wafer and a part of the first V-groove;
   forming a second V-groove on a lower surface of the wafer, wherein the second V-groove is spaced apart from a bottom side of the first V-groove;
   forming a second electrode to cover a part of the lower surface of the wafer and a part of the second V-groove;
   forming a through hole to penetrate the substrate extending from the first-groove to the second V-groove; and
   connecting the first electrode with the second electrode.

7. The method of claim 6, further comprising forming U-shaped grooves on the lower surface of the wafer respectively on both sides of the second V-groove.

8. The method of claim 7, further comprising forming a trench to be connected with the second V-groove on the lower surface of the wafer, wherein the second electrode id formed to cover the part of the second V-groove, a part of the trench, and a part of the U-shaped grooves.

9. The method of claim 6, further comprising forming a polymer on the lower surface of the wafer to isolate the second electrode from a material formed under the wafer.

10. The method of claim 6, wherein the second V-groove is formed symmetrically to the first V-groove.

11. The method of claim 10, wherein the second V-groove is formed to leave a part of the wafer and not to connect the first V-groove with the second V-groove.

12. The method of claim 6, further comprising connecting the first electrode or the second electrode with another package by soldering, wire bonding, or flip-chip bonding.

13. The method of claim 6, wherein the first electrode is formed on both sides of the first V-groove to be disconnected at a center of the first V-groove.

14. The method of claim 6, wherein the second electrode is formed on both sides of the second V-groove to be disconnected at a center of the second V-groove.

* * * * *